United States Patent
Mudd et al.

(10) Patent No.: US 7,626,457 B2
(45) Date of Patent: Dec. 1, 2009

(54) AGC MODULE AND METHOD FOR CONTROLLING NOISE FIGURE AND INTERMODULATION CHARACTERISTICS THEREIN

(75) Inventors: Mark Mudd, Wiltshire (GB); Isaac Ali, Bristol (GB); Ruiyan Zhao, Swindon (GB); Nick Cowley, Wiltshire (GB); Colin Perry, Swindon (GB); Richard Goldman, Somerford Keynes (GB)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/863,701

(22) Filed: Sep. 28, 2007

(65) Prior Publication Data

US 2009/0085660 A1 Apr. 2, 2009

(51) Int. Cl.
*H03F 3/45* (2006.01)
(52) U.S. Cl. ........................ 330/254; 330/283
(58) Field of Classification Search ................ 330/254, 330/283, 252; 327/359
See application file for complete search history.

(56) References Cited

U.S. PATENT DOCUMENTS

| 6,917,257 | B2 * | 7/2005 | Gondi ................. 330/254 |
| 7,436,262 | B2 * | 10/2008 | Ashby et al. .......... 330/254 |
| 2009/0085660 | A1 | 4/2009 | Mudd | |

* cited by examiner

*Primary Examiner*—Khanh V Nguyen
(74) *Attorney, Agent, or Firm*—Grossman, Tucker, Perreault & Pfleger, PLLC (57) ABSTRACT

An Automatic Gain Control (AGC) module for controlling Noise Figure (NF) and IM characteristics therein is disclosed. The AGC module comprises a plurality of AGC stages. Each AGC stage comprises a differential amplifier circuit, an input signal transistor and a current-steering circuit. Differential amplifier circuits of the plurality of AGC stages receive control signals at their differential inputs and their output is connected to a common load. The input signal transistors of the plurality of AGC stages receive a common input signal and is further coupled to the differential amplifier circuit and the current-steering circuit. The current-steering circuits and the control signals at the differential amplifier circuits control gain of the each AGC stage of the plurality of AGC stage, which is used to control the NF and the IM characteristics.

12 Claims, 8 Drawing Sheets

FIG. 8

AGC MODULE AND METHOD FOR CONTROLLING NOISE FIGURE AND INTERMODULATION CHARACTERISTICS THEREIN

FIELD

The present disclosure relates to tuners in communication devices, and more particularly describes compound Automatic Gain Control (AGC) modules in the tuners and a method to control the Noise Figure (NF) and intermodulation characteristics in the compound AGC modules.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

Like reference numerals refer to like parts throughout the description of several views of the drawings.

DETAILED DESCRIPTION OF THE DISCLOSURE

For a thorough understanding of the present disclosure, reference is to be made to the following detailed description, including the appended claims, in connection with the above-described drawings. Although the present disclosure is described in connection with exemplary embodiments, the disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting.

The terms "first," "second," and the like, herein do not denote any order, quantity, or importance, but rather are used to distinguish one element from another. The terms "a" and "an" herein do not denote a limitation of quantity, but rather denote the presence of at least one of the referenced item.

Figure 1:
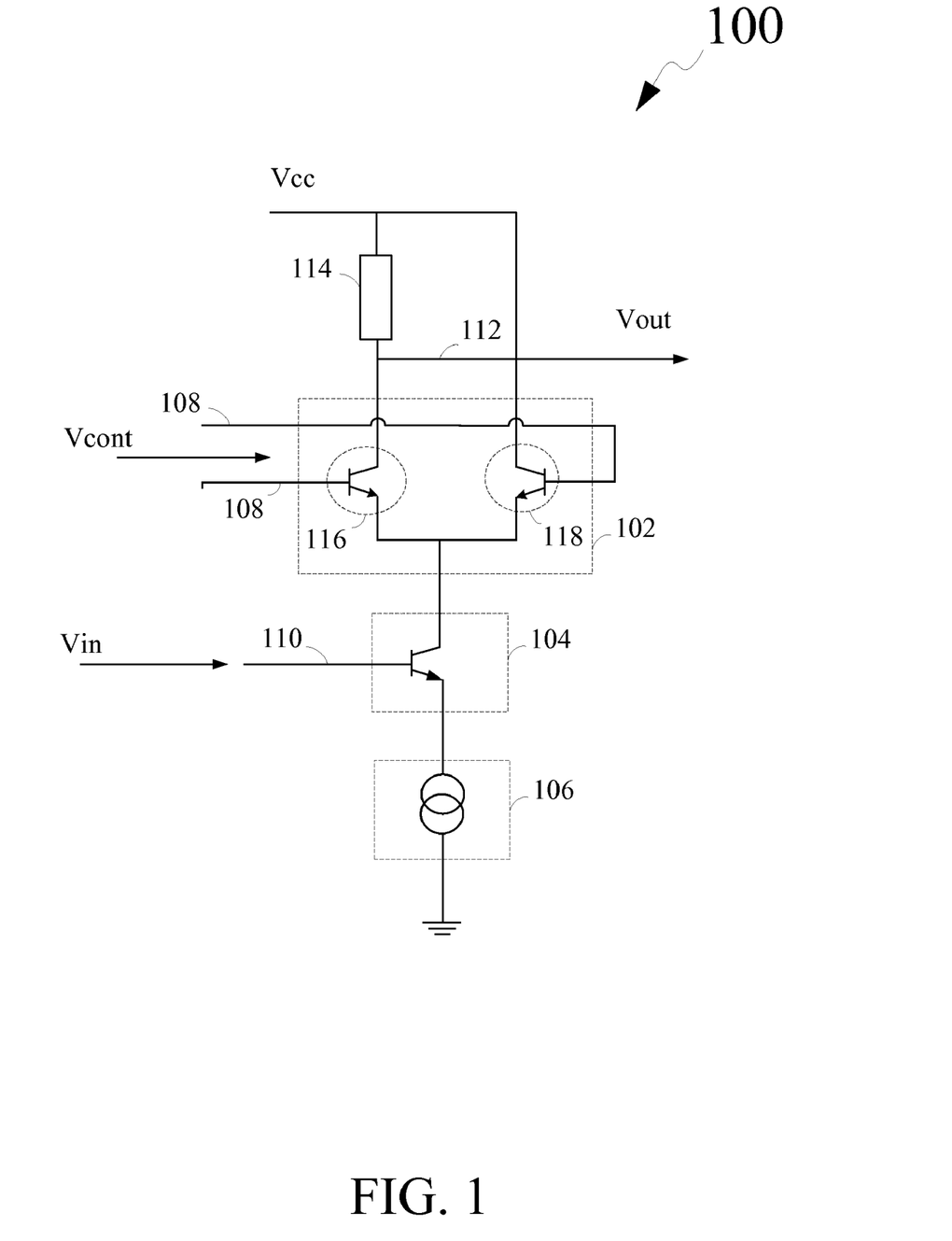
FIG. 1 is a circuit diagram illustrating a prior-art AGC circuit.

Referring to FIG. 1, a prior-art Automatic Gain Control (AGC) circuit 100 (hereinafter referred to as "circuit 100") is shown. The circuit 100 comprises a differential amplifier 102, a transistor 104 and a current-source circuit 106. The differential amplifier 102 comprises transistors 116 and 118, which are connected at a common emitter point. The common emitter point of the differential amplifier 102 is a point where emitters of the transistors 116 and 118 are connected. A load 114 is connected to a first output of the differential amplifier 102, the second output of the differential amplifier is connected to the supply voltage Vcc. The load resistor 114 converts the output current from the differential amplifier to an output voltage, Vout. The common emitter point of the differential amplifier 102 is connected to a collector of the transistor 104. An input signal (represented as 'Vin' in FIG. 1) is applied to the circuit 100 at a base 110 of the transistor 104. An emitter of the transistor 104 is connected to the current-source circuit 106. The current-source circuit 106 may be deemed as a current source which supplies a standing current to the transconductance stage 104. The transconductance stage will output both a standing current determined by stage 106 and a signal current determined by the transconductance of the stage 104 and the magnitude of the input voltage Vin. The magnitude of the signal current is determined by Vin*gm, where gm is the transconductance of 104. The output current from stage 104 is passed to the common emitter terminal of the amplifier 102. The stage 102 is arranged to steer the current input to the common emitter either in to the load 114, which is a current at the first output 112 of the differential amplifier 102 (hereinafter referred to as 'output current') or into Vcc. A control signal (represented as 'Vcont' in FIG. 1) is applied to differential inputs 108 of the differential amplifier 102. The control signal serves to control the output current. A typical AGC circuit 100, as described, may be deployed in an integrated circuit as a stacked Gilbert cell with current-steering capabilities. In this case, the signal is input to a gm stage of the transistor 104 and the output current at the load 114 may be steered through an undegenerated long tailed pair of the current-steering circuit 106. This may provide a variable gain in the circuit 100 by means of steering the output current away from the load 114.

It is observed that the circuit 100, as described above, has undesirable Noise Figure (NF) and intermodulation characteristics associated with a gain of the circuit 100. In the circuit 100, for some gain back-offs the NF varies by a range greater than 1 dB/dB with variation in the gain of the circuit 100. Further, the intermodulation characteristics such as an intermodulation intercept point (IP) in the circuit 100 degrades with a gain back-off of amplifiers used in the circuit 100, which results in an unacceptable degradation in the carrier to noise ratio (C/N) when the intermodulation (IM) is taken into account, which may also be represented as (C/(N+IM)). It may be observed that for the first few dB of the gain back-off (for example, up to 6 dB), there exists a substantial degradation in the (C/(N+IM)).

From the signal handling perspective in a tuner of a radio receiver of a communication device, it is desired that the circuit 100, used as an AGC stage, is applied as soon as possible to protect the internal stages of the radio receiver from degradation of the IM characteristics. Therefore, it is necessary to dispose the circuit 100 at or as near as possible at the front-end of the radio receiver. Conversely, from the additive noise perspective, it is desirable to delay the gain back-off of the circuit 100 at the front-end so as to deliver an improving NF. This can be further understood by the fact that with an increase in the input signal, the gain back-off of the circuit 100 also increases. The above requirement necessitates disposing the circuit 100 after an input Low Noise Amplifier (LNA) gain protection.

Considering a first case, where the circuit 100 is deployed at the front-end of the radio receiver. Assuming the circuit 100 has sufficient gain to substantially protect the noise in the input signal from internal stage noise therein. It is required that the variation in the NF should be substantially less than 1 dB/dB with the gain back-off so as to deliver an improved Carrier-to-Noise ratio (C/N). Conversely, when the NF of the circuit 100 varies at equal to 1 dB/dB or greater than 1 dB/dB with gain back-off, the circuit 100 would not be able to deliver an improved C/N. However, in a second case, the problem of greater variation in the NF in the first case may be partially dealt with by deploying the LNA prior to the circuit 100. Further, applying the LNA in front-of the circuit 100 affects the IM characteristics as higher signals are incident at the input of the circuit 100.

Based on the above discussions, it is evident to a person skilled in the art that the use of the circuit 100 in the radio receiver leads to a variation in NF by greater than 1 dB/dB along with degradation in the IM characteristics with the gain back-off. The solutions that may be implemented to solve the problems of the circuit 100 as discussed in both the first and the second cases are not optimum from a performance, power or silicon implementation perspective.

Figure 2:
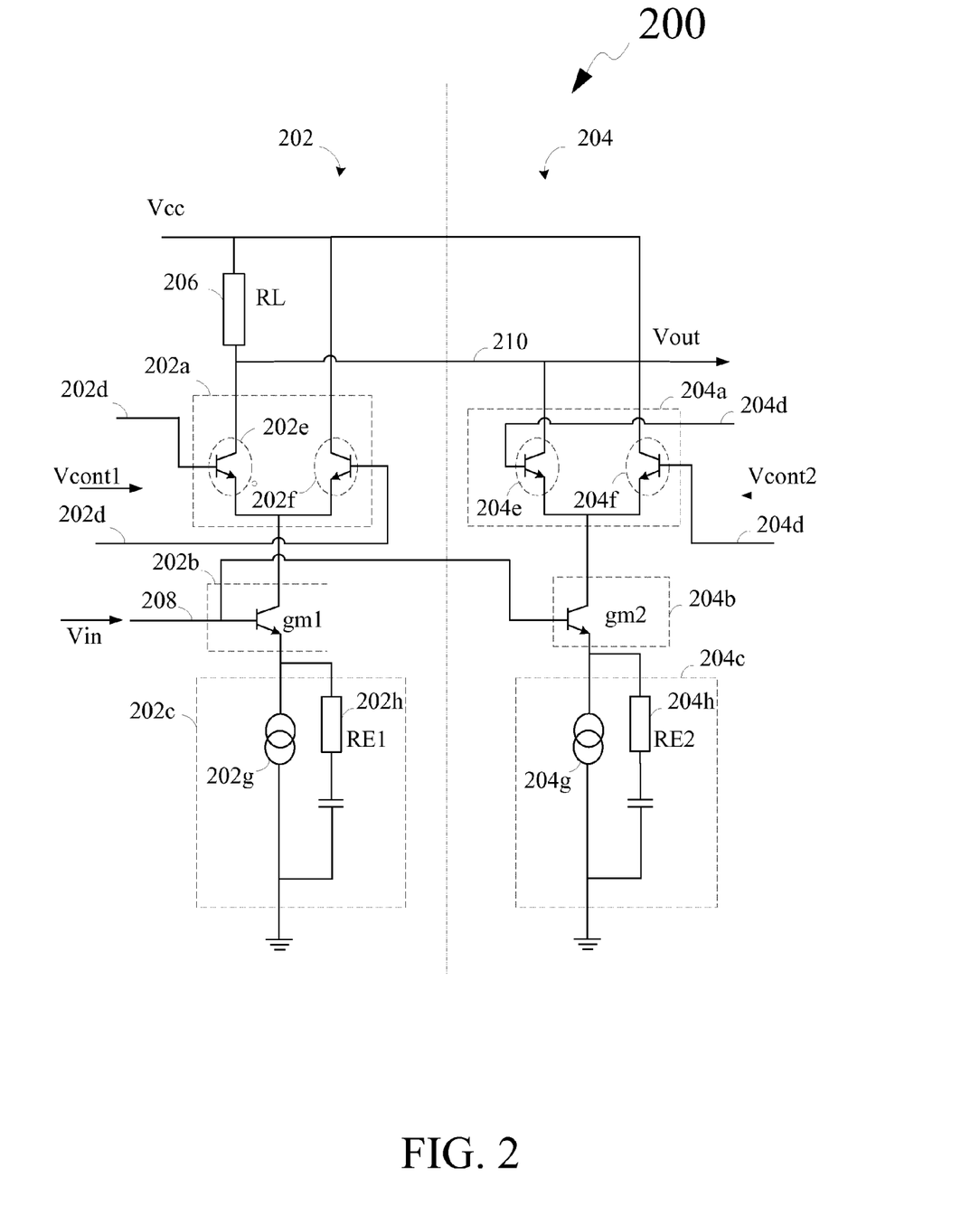
FIG. 2 is a circuit diagram illustrating an AGC module, according to an exemplary embodiment of the present disclosure.

Referring now to FIG. 2, a circuit diagram illustrating an AGC module 200 (hereinafter referred to as "module 200") is shown, according to an exemplary embodiment of the present disclosure. The module 200 comprises a plurality of AGC stages such as an AGC stage 202 and an AGC stage 204. The AGC stage 202 comprises a differential amplifier circuit 202a, an input signal transistor 202b and a current-source circuit 202c. The differential amplifier circuit 202a comprises a transistor 202e and a transistor 202f, an output 210, and a common emitter point. Emitters of the transistors 202e and 202f are connected at the common emitter point. Bases of the transistors 202e and 202f are configured to receive differential inputs 202d of the differential amplifier circuit 202a. A load 206 is connected to the output 210 of the differential amplifier circuit 202a. The transistor 202b may form, at least part, the transconductance stage gm1. The input signal transistor 202b (hereinafter referred to as 'transistor 202b') comprises an emitter, a base and a collector. The base of the transistor 202b is configured to receive a common input signal (hereinafter referred to as 'Vin') at gm1 stage of the transistor 202b from a common input terminal 208. The collector of the transistor 202b is connected to the common emitter point of the differential amplifier circuit 202a. The emitter of the transistor 202b is connected to the current-source circuit 202c. The current-source circuit 202c comprises a current source 202g and a degeneration resistance 202h placed in parallel to the current source 202g.

The configuration of the AGC stage 204 is similar to the AGC stage 202. The AGC stage 204 comprises a differential amplifier circuit 204a, an input signal transistor 204b and a current-source circuit 204c. The differential amplifier circuit 204a comprises a transistor 204e and a transistor 204f, the output 210, and a common emitter point. Emitters of the transistors 204e and 204f are connected at the common emitter point. The base of transistors 204e and 204f form the differential inputs 204d of the differential amplifier circuit 204a. A load 206 is connected to the output 210 of the differential amplifier circuit 204a. The transistor 204b may form, at least part, the transconductance stage gm2. The input signal transistor 204b (hereinafter referred to as 'transistor 204b') comprises an emitter, a base and a collector. The base of the transistor 204b is configured to receive the Vin from the common input terminal 208 at the gm2 stage of the transistor. The collector of the transistor 204b is connected to the common emitter point of the differential amplifier circuit 204a. The emitter of the transistor 204b is connected to the current-source circuit 204c. The current-source circuit 204c comprises a current source 204g and a degeneration resistance 204h placed in parallel to the current source 204g.

The module 200 as explained herein is for the purposes of description only. It will be apparent to a person skilled in the art that the module 200 may include more number of AGC stages similar to the AGC stages 202 and 204 (as shown in FIG. 2). The plurality of AGC stages has a common load which is connected to the outputs of differential amplifier circuits of the each AGC stage of the plurality of AGC stages. For example, as shown in FIG. 2, the load 206 is connected to the output 210 of the differential amplifier circuits 202a and 204a of the AGC stages 202 and 204 respectively, thereby acting as the common load for the module 200. Similarly, the Vin is applied to the bases of the transistors 202b and 204b through the common input terminal 208. The Vin for the described embodiment comprises an RF signal. However, it is obvious to a person skilled in the art that the module 200 may also be used effectively for input signals other than RF signals.

A first control signal (represented as 'Vcont1' in FIG. 2) is applied to the differential inputs 202d of the differential amplifier circuit 202a to control the output current of the differential amplifier circuit 202a. A second control signal (represented as 'Vcont2' in FIG. 2) is applied to the differential inputs 204d of the differential amplifier circuit 204a to control the output current of the differential amplifier circuit 204a. In other words, the Vcont1 and the Vcont2 may be used to control a gain of the AGC stage 202 and the AGC stage 204 respectively. The Vcont1 and the Vcont2 are derived from a common control signal (hereinafter referred to as 'master control voltage'). The Vcont1 and the Vcont2 are related by a pre-determined relationship, which is further described in conjunction with FIG. 5. It will be apparent to a person skilled in the art that the Vcont1 may control the gain of the AGC stage 202. Similarly, the Vcont2 may control the gain of the AGC stage 204. Therefore the Vcont1, the Vcont2, can control a composite gain of the module 200. The composite gain of the module 200 may depend upon the ratio of an output voltage at the output 210 (represented as 'Vout' in FIG. 2) to the Vin. The output voltage Vout can be controlled by the Vcont1 and Vcont2 which steer the output currents from transistors 202b and 204b respectively into the output load 206, dependant on the magnitude and sense of the Vcont1 and Vcont2. Therefore, the NF and the IM characteristics of the module 200 may be controlled by controlling the composite gain of the module 200.

Figure 3:
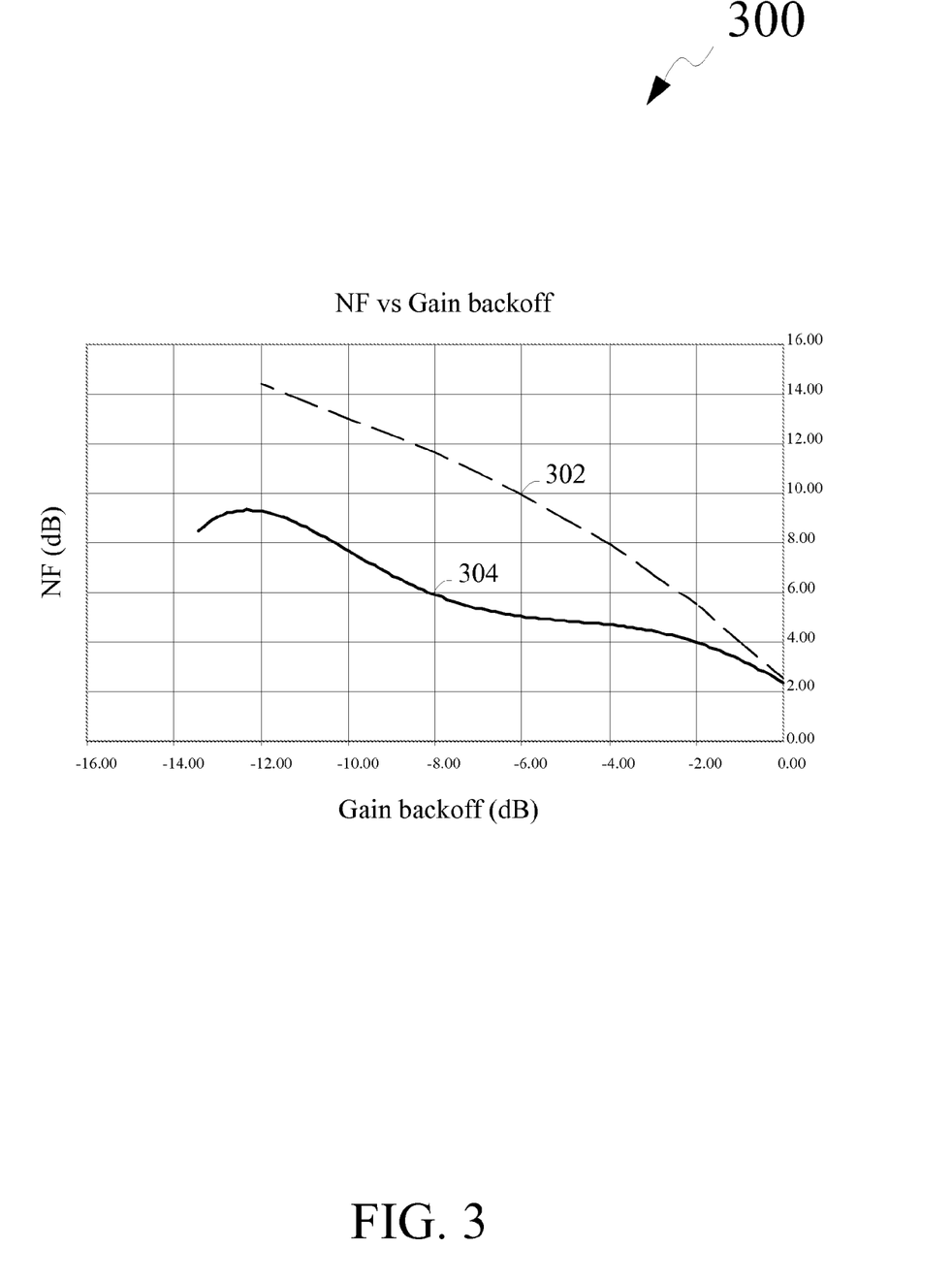
FIG. 3 is a graph representing a comparison of NF characteristic variation with gain back-off for the AGC module of the present disclosure and the prior art AGC circuit.

Although the present disclosure is explained above in context of a bipolar transistor configuration for the differential amplifier circuits 202a and 204a, and the transistors 202b and 204b, it will be obvious to a person skilled in the art that the bipolar devices may be suitably replaced with unipolar devices or any other equivalent device to achieve similar results. Hence, in another embodiment of the present disclosure, the bipolar junction transistors (BJTs) 202b, 202e, 202f, 204b, 204e and 204f, of the module 200 may be changed to corresponding Field-Effect Transistors (FET). Therefore the emitter, base and the collector of the BJTs may be changed to the source, gate and drain of the FETs respectively FIG. 3 is a graph 300 representing a comparison of variation in the NF with respect to the gain back-off for the circuit 100 and the module 200. The graph 300 is plotted for the NF (in dB) versus the gain back-off (in dB). The graph 300 includes a plot 302 and a plot 304. The plot 302 represents the NF of the circuit 100. The plot 304 represents NF of the module 200. It will be evident to a person skilled the art from the plots 302 and 304 that the degradation in the NF with a gain back-off for the module 200 is substantially less than the degradation in the NF with the gain back-off for the circuit 100.

Figure 4:
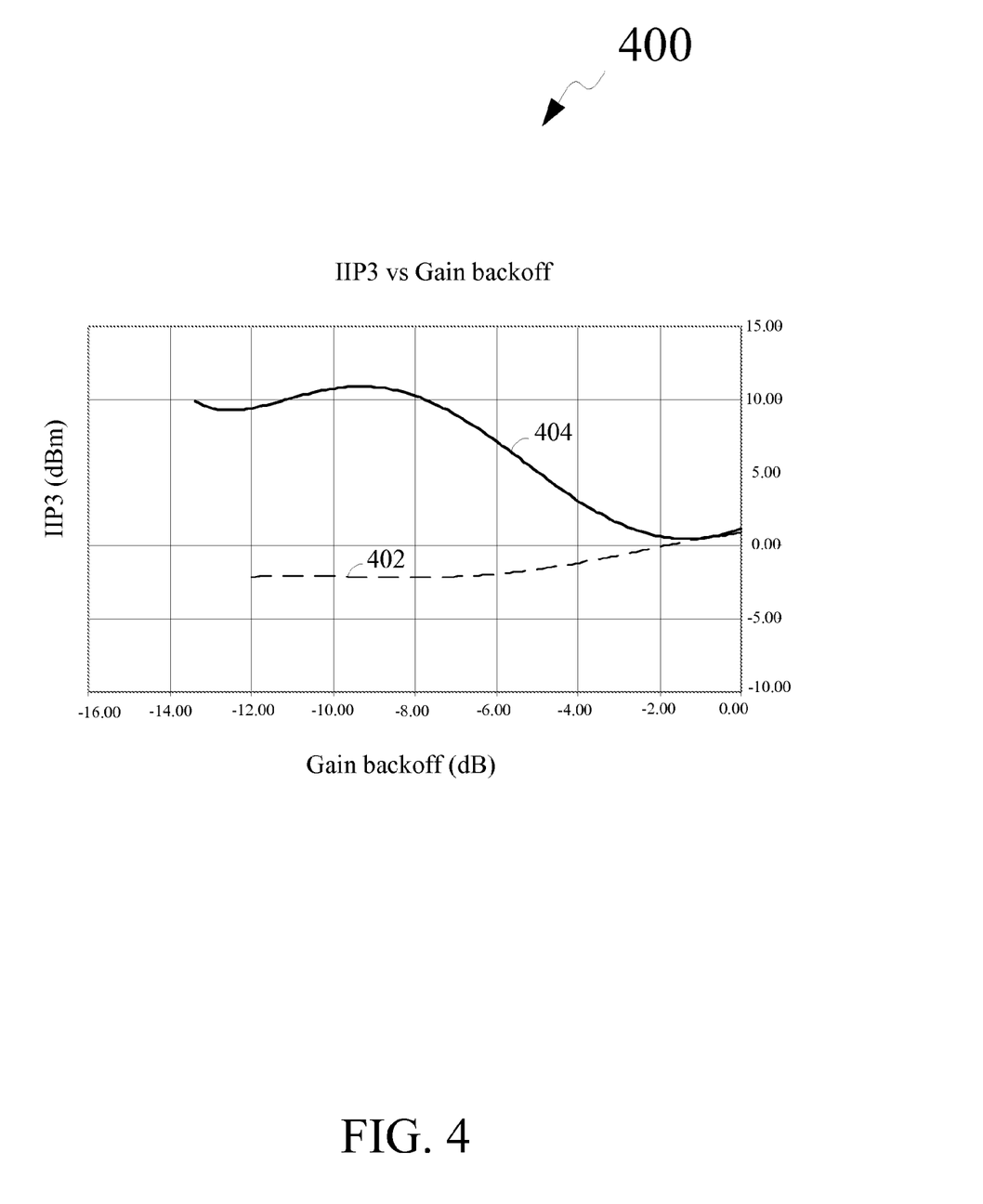
FIG. 4 is a graph representing a comparison of variation of third-order intercept of intermodulation characteristics with respect to gain back-off for the AGC module as per the present disclosure and the prior art AGC circuit.

FIG. 4 illustrates a graph 400 representing a comparison of variation of a third-order intercept of the IM characteristics (in dBm) with respect to the gain back-off (in dB) for the circuit 100 and module 200. The third-order intercept of the IM intercept point (IP) is plotted for the intermediate characteristic. The graph 400 includes a plot 402 and a plot 404. The plot 402 represents a variation of third-order intercept of the IP (shown as IIP3 in FIG. 4) with respect to the gain back-off for the circuit 100. The plot 404 represents a variation of the IIP3 with respect to the gain back-off for the module 200. It is evident from the analysis of the two plots 402 and 404 that the IIP3 for the module 200 increases with the gain back-off, which is opposite of the trend followed by the IIP3 for the circuit 100. In other words, IIP3 in the module 200 increases with the gain back-off as opposed to the degradation in the IIP3 in the circuit 100 with the gain back-off.

Figure 5:
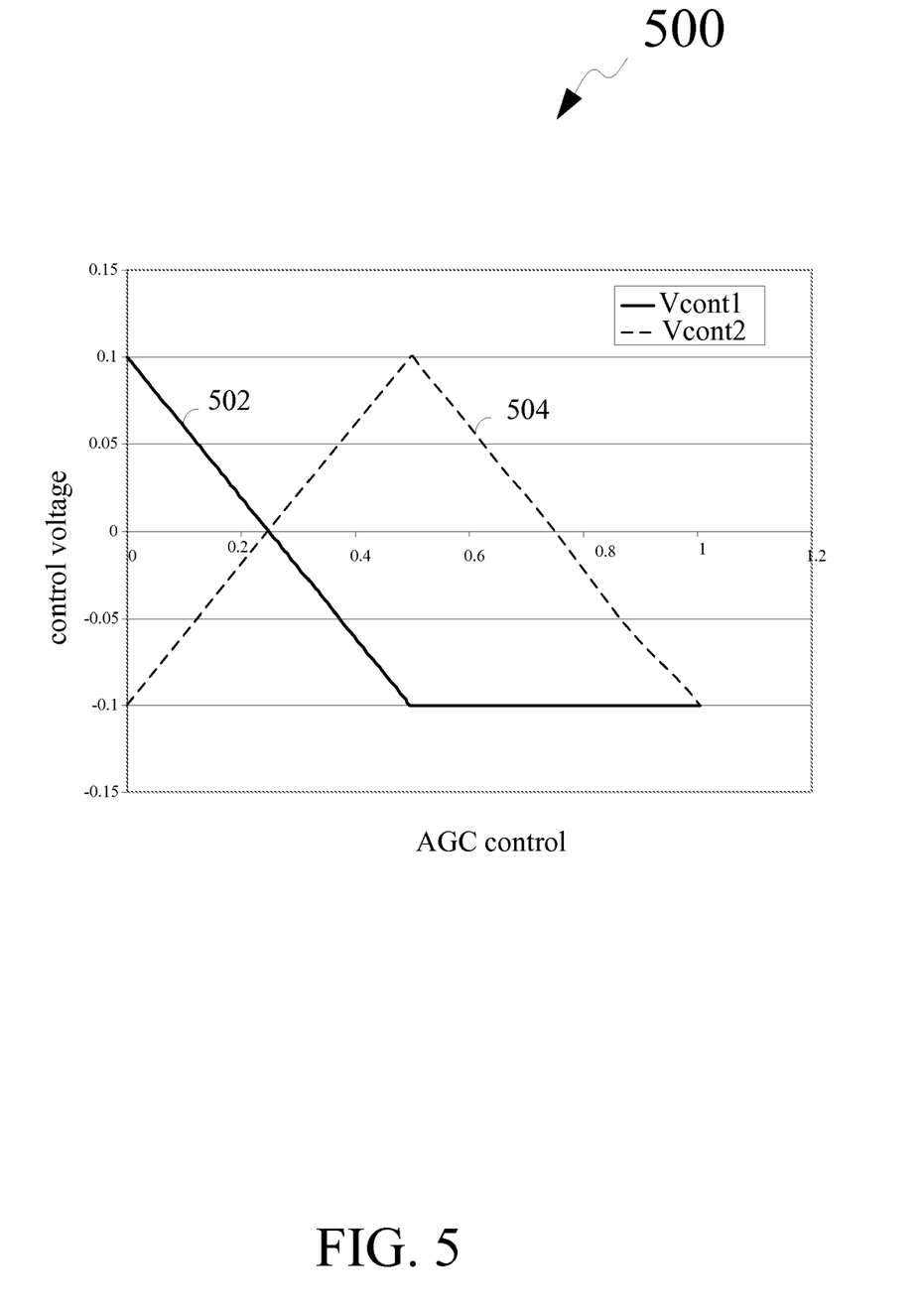
FIG. 5 is a graph representing a variation of control voltages Vcont1 and Vcont2 applied to AGC stages of the AGC module with respect to master control voltage according to an exemplary embodiment of the present disclosure.

FIG. 5 is a graph 500 illustrating a variation of the Vcont1 and the Vcont2 with respect to the master control voltage as applied in the module 200. The graph 500 includes a plot 502 and a plot 504. The plot 502 represents a variation of the Vcont1 applied to the differential input 202d of the differential amplifier circuit 202a with respect to the master control voltage. The plot 504 represents a variation of the Vcont2 applied to the differential input 204d of the differential amplifier circuit 204a with respect to the master control voltage. Further, the plots 502 and 504 also demonstrate the pre-determined relationship between the Vcont1 and the Vcont2. The pre-determined relationship between the Vcont1 and the Vcont2 depends upon the gain of the AGC stages 202 and 204. In another embodiment of the present disclosure, the pre-determined relationship between the Vcont1 and the Vcont2 also depends upon the composite gain of the module 200. It will be obvious to a person skilled in the art from the plots 502 and 504 that as the Vcont1 decreases from a maximum value toward a minimum value with increase in master control voltage, the Vcont2 follows an equal and opposite trend that is increasing from the minimum value to the maximum value. It is also evident that as the Vcont2 reaches its maximum value, the Vcont1 achieves its minimum value. Thereafter, upon achieving the maximum value, the Vcont2 inverts and starts decreasing towards the minimum value.

The Vcont1 and the Vcont2 are applied to the differential inputs 202d and 204d of the differential amplifier circuits 202a and 204a respectively to control the output current at the load 206. As a result, the composite gain of the module 200 may be controlled, which in turn controls the NF and IM characteristics of the module 200 as the NF and the IM characteristics depend upon the gain of the module 200. In another embodiment of the present disclosure, the Vcont1 and the Vcont2 for the ACG stages 202 and 204 may be ratioed or offset to ensure that monotonicity is maintained over full NF and IM characteristics process.

Figure 6:
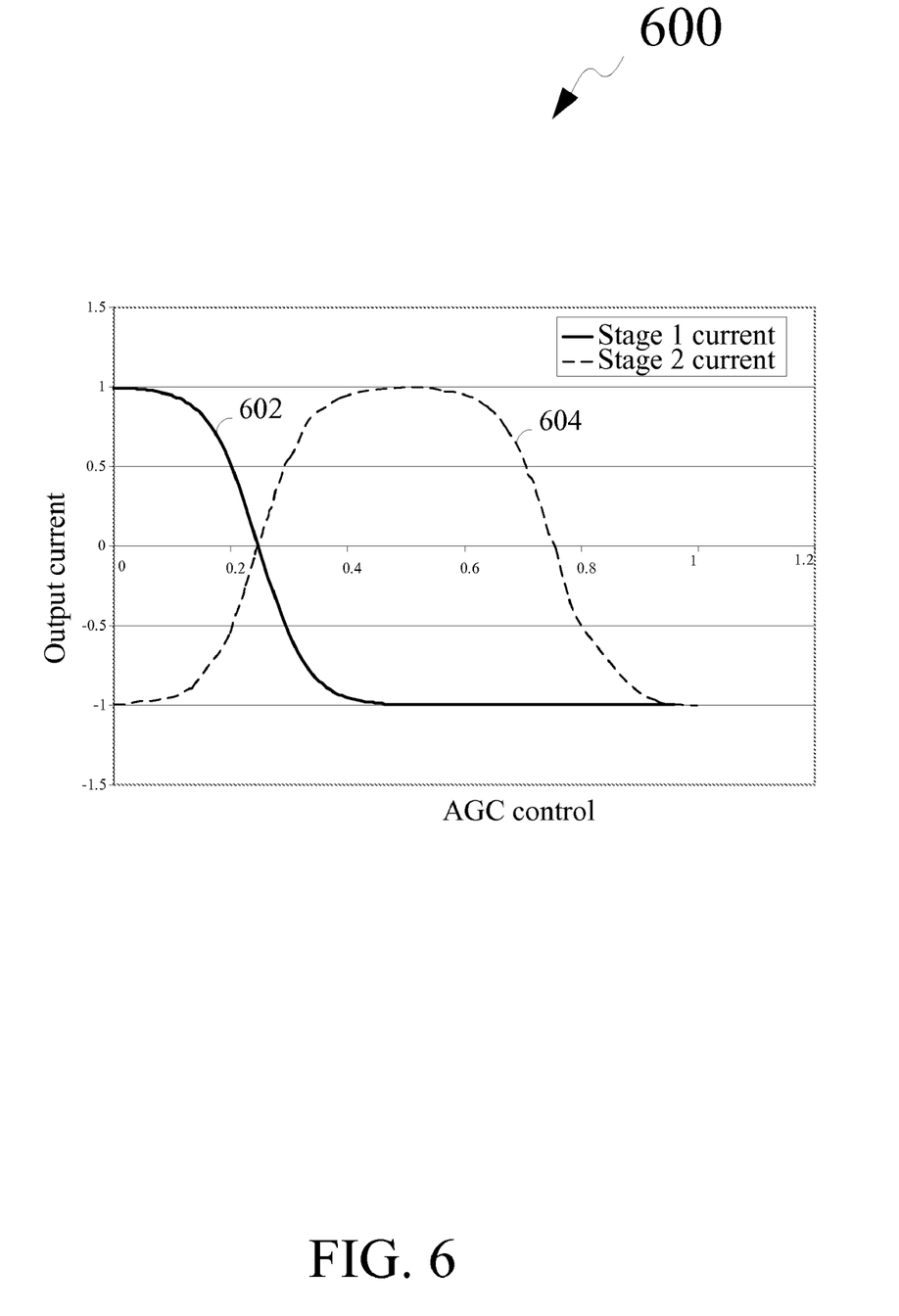
FIG. 6 is a graph representing a variation of load current with master control voltage according to an exemplary embodiment of the present disclosure.

Referring now to FIG. 6, a graph 600 representing a variation of the output current at the load 206 with respect to the master control voltage is shown. The graph 600 includes a plot 602 and a plot 604. The plot 602 represents the variation of the output current with respect to the master control voltage for the AGC stage 202. The plot 604 represents a variation of the output current with respect to the master control voltage for the AGC stage 204. It is evident that the variation of the output current for the AGC stages 202 and 204 follows a similar pattern similar as the variation of the Vcont1 and Vcont2 with respect to master control voltage, as described in conjunction of FIG. 5 of the present disclosure. Therefore, it can be concluded that the Vcont1 and the Vcont2 control the output current, which in turn, controls the composite gain of the module 200. Further, the controlled composite gain of the module 200 may used to control the NF and the IM characteristics of the module 200.

The controls of the NF and the IM characteristics in the module 200 can also be understood by the following example. Referring again to FIG. 2, the gain of the AGC stage 202 of the module 200 is RL/(RE1+1/gm1) wherein gm1 is a transconductance of the transistor 202b, RL is the load 206 and RE1 is the degeneration resistance 202h for the AGC stage 202. Similarly, the gain for AGC stage 204 is RL/(RE2+1/gm2), where gm2 is a transconductance of the signal transistor 204b, RL is the load 206 and RE2 is the degeneration resistance 204h for the AGC stage 204. Further, considering a case where the gain of the AGC stage 202 is 6 dB higher than the AGC stage 204 and all other parameters for the AGC stages 202 and 204 are same. For the aforementioned case, the value for RE2 will be twice that of RE1, i.e. RE2=2*RE1. Furthermore, it is observed that the composite gain of the module 200 is reduced by 6 dB when the Vcont1 transitions from a maximum value to minimum value and conversely the Vcont2 transitions from a minimum value to a maximum value.

To analyze the NF characteristics for the module 200, a worst case scenario of the aforementioned case may be considered where the NF is dependent on the value of degeneration resistances i.e. RE1 and RE2. For such a scenario the change in NF characteristic for a 6 dB change in the composite gain of the module 200 would be approximately 3 dB since the noise voltage of a resistive element is proportional to the square root of said resistance. For the circuit 100, a change in NF characteristic for a 6 dB change in the gain of the circuit 100 would be a value greater than 6 dB.

To analyze the IM characteristics for the aforementioned case, it may be considered that when all other parameters are equal, the IIP3 for the module 200 is proportional to the value of degeneration resistance RE1 and RE2. As RE2 is twice of RE1 for this case, the signal handling capacity of the module 200 would double thereby causing the IIP3 to increase by 6 dB for the module 200 which is unlikely for the IIP3 in case of the circuit 100. The exemplary analysis of the module 200 clearly reflects the capability of the module 200 of a superior performance and an effective control of the NF and the IM characteristics.

Figure 7:
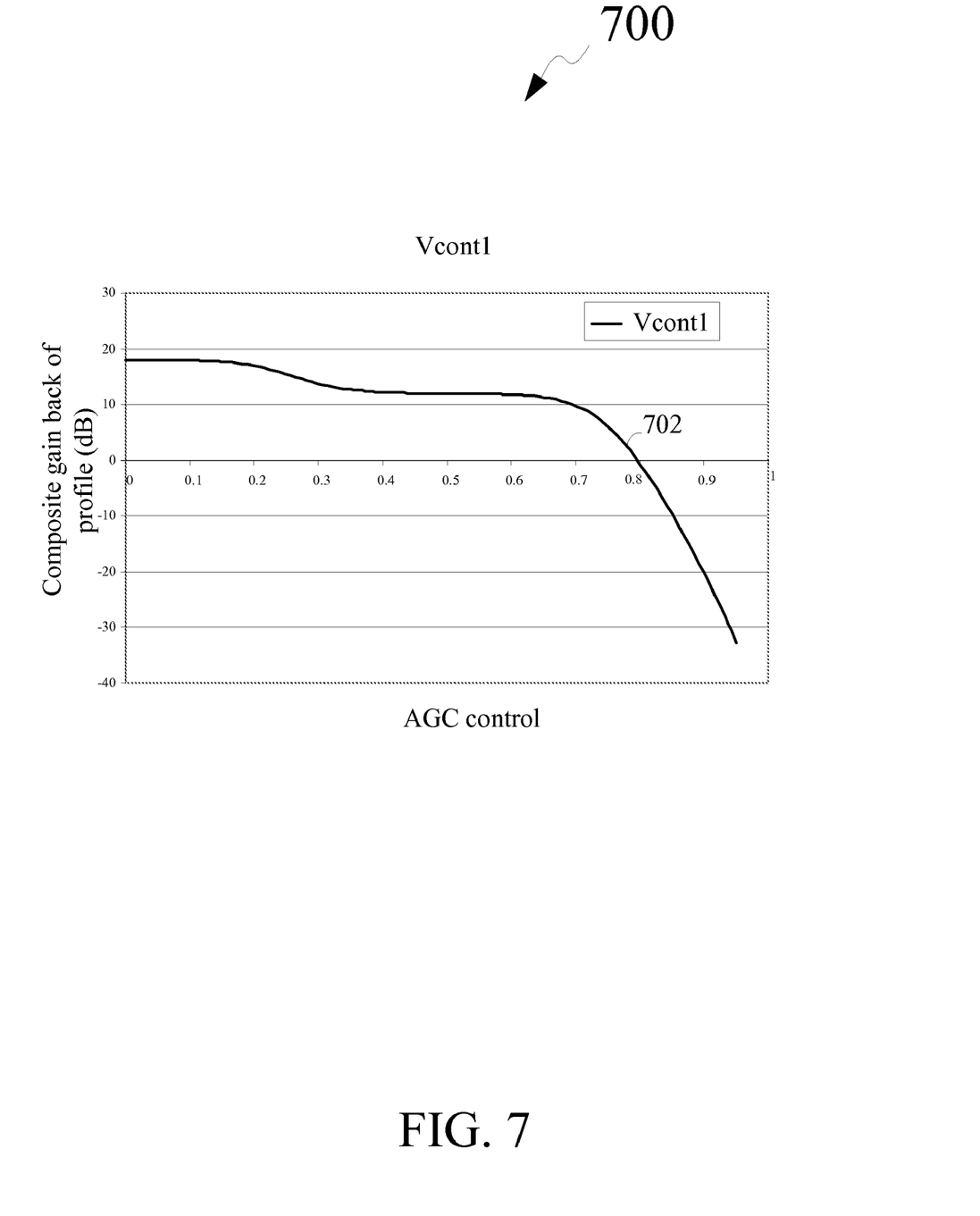
FIG. 7 is a graph representing variation of gain of the AGC module with master control voltage according to an exemplary embodiment of the present disclosure.

FIG. 7 is a graph 700 representing a variation of a composite gain of the module 200 with respect to the master control voltage. The graph 700 includes a plot 702. The plot 702 represents a composite gain back-off of the module 200 with reference to the Vcont1, when the AGC stage 202 has a gain of 18 dB and the AGC stage 204 has a gain of 12 dB. The variation in the composite gain of the module 200 with the master control voltage is evident from the plot 702.

Figure 8:
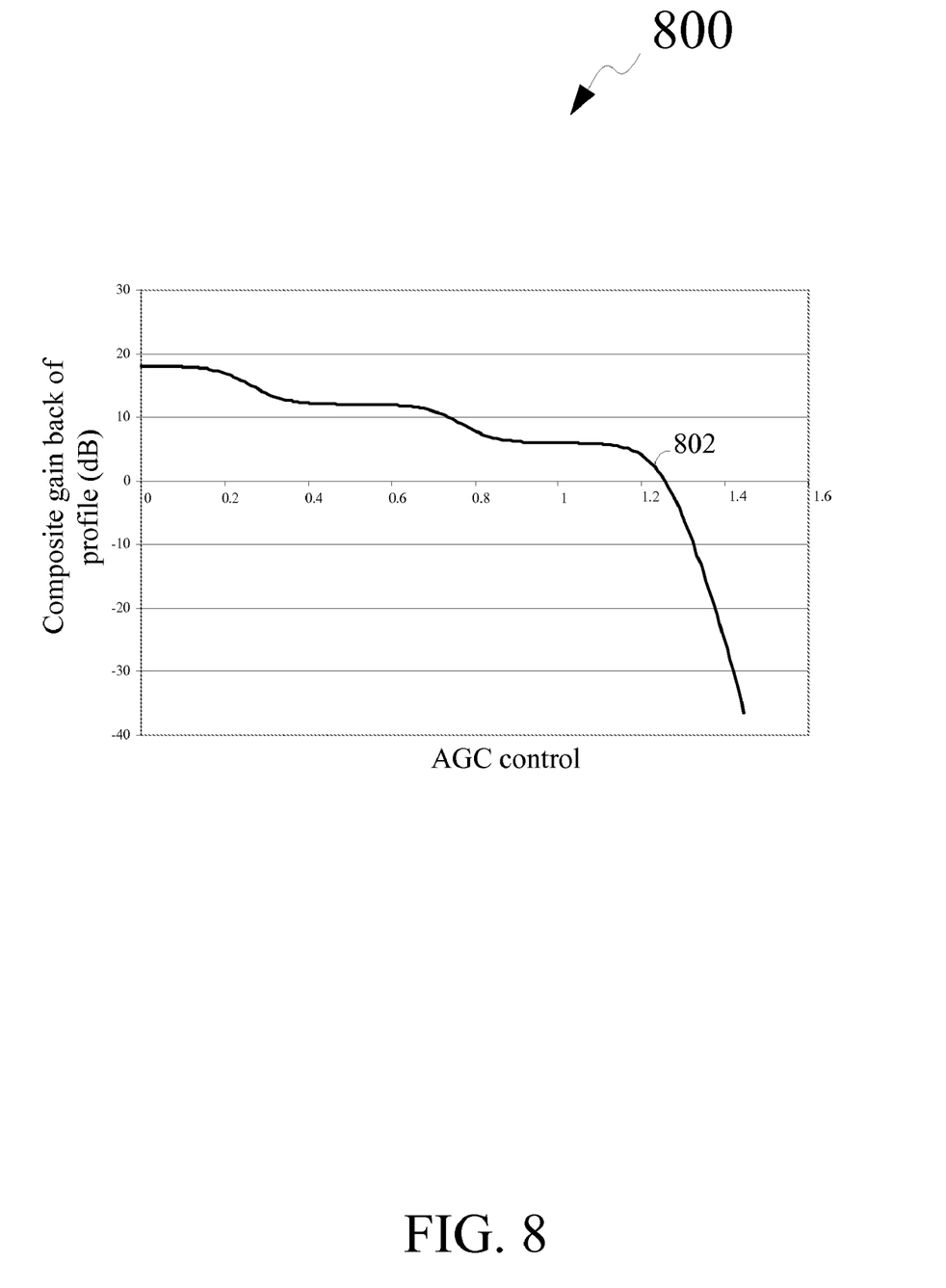
FIG. 8 is a graph representing variation of gain of an AGC module with master control voltage according to another embodiment of the present disclosure.

While the present disclosure has been explained herein with reference to the module 200 comprising two AGC stages 202 and 204. However, various modifications of the module 200 are possible. In another embodiment of the present disclosure, the AGC module 200 may be extended to have more than two AGC stages. FIG. 8 of the present disclosure illustrates a graph 800 representing variation of the gain of an AGC module with respect to master control voltage for another embodiment of the present disclosure. In this embodiment of the present disclosure, the AGC module comprises three AGC stages. The graph 800 includes a plot 802 which represents variation of the gain of the AGC module with respect to the master control voltage by considering gains of the three AGC stages as 18 dB, 12 dB and 6 dB respectively.

In another embodiment of the present disclosure, at least one AGC stage of the plurality of AGC stages can have a constant gain. For example, the last AGC stage, e.g. the AGC stage 204 of the described embodiment, could have a constant gain thereby fixing the reduction in the composite gain of the module 200 to a particular value.

Further, according to an embodiment of the present disclosure, the control of a Noise Figure (NF) and the IM characteristics in an AGC module may be achieved by the applying the following method. The method comprises providing a plurality of AGC stages in the AGC module. The each AGC stage of the AGC module comprises a differential amplifier circuit, an input signal transistor and a current-source circuit. The method further comprises applying a common input signal to the input signal transistor of the each AGC stage of the plurality of the AGC stages. The common input signal applied to the base of the input signal transistor may be an RF signal. However, according to the present method, signals other than the RF signals may also be applied to the base of the input signal transistor.

Furthermore, the method comprises providing a common load to an output of the differential amplifier circuit of the each AGC stage of the plurality of the AGC stages. Thereafter, the method comprises controlling a gain of the each AGC stage based on applying a control signal to the differential inputs of the differential amplifier circuit of the each AGC stage and controlling a current at the output of the differential amplifier circuit of the each AGC stage by the current-steering circuit. Thereafter, the method comprises controlling the NF and the IM characteristics in the AGC module based on the controlled gain of the each AGC stage of the plurality of AGC stages The control signals applied at the differential inputs of the differential amplifier circuits of the plurality of AGC stages have a pre-determined relationship. The pre-determined relationship of the control signals can be chosen based on gain of the each AGC stage of the plurality of AGC stages or a composite gain of the plurality of AGC stages. The composite gain of the plurality of AGC stages is an overall gain of the each AGC stage of the plurality of AGC stages. It will be obvious to a person skilled in the art the gain of the each AGC stage of the plurality of AGC stages is controllable by a proper selection of control signals. However, in another embodiment of the present disclosure, at least one AGC stage can have a constant gain in order to fix the reduction in the composite gain of the module 200 to a particular value. The method is described above by considering transistors used in the input signal transistors and the differential amplifier circuit as Bipolar Junction Transistors (BJTs). However, the above described method may be equally implemented with Field-Effect Transistors (FETs) in place of the BJTs.

The foregoing descriptions of specific embodiments of the present disclosure have been presented for purposes of illustration and description. They are not intended to be exhaustive or to limit the disclosure to the precise forms disclosed, and obviously many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. An Automatic Gain Control (AGC) module for controlling Noise Figure (NF) and intermodulation (IM) characteristics therein, the AGC module comprising:
   a first AGC stage comprising:
      a first differential amplifier circuit having differential inputs, an output and a common emitter point, the differential inputs configured to receive a first control signal;
      an first input signal transistor comprising an emitter, a base and a collector, the collector of the first input signal transistor connected to the common emitter point of the first differential amplifier circuit; and
      a first current-source circuit connected to the emitter of the first input signal transistor;
   a second AGC stage comprising:
      a second differential amplifier circuit having differential inputs, an output and a common emitter point, the differential inputs configured to receive a second control signal;
      a second input signal transistor comprising an emitter, a base and a collector, the collector of the second input signal transistor connected to the common emitter point of the second differential amplifier circuit; and
      a second current-source circuit connected to the emitter of the second input signal transistor;
   wherein a common input signal is received at bases of the first and second input signal transistors;
   wherein a common load is applied at outputs of the first and second differential amplifier circuits; and
   wherein the first control signal is configured to control a gain of said first AGC stage and said second control signal is configured to control a gain of said second AGC stage, and said first control signal is distinct, at least in part, from said second control signal and said first and second control signals have a predetermined relationship.

2. The AGC module of claim 1, wherein the pre-determined relationship of the first and second control signals is based on the gain of each AGC stage.

3. The AGC module of claim 1, wherein the pre-determined relationship of the first and second control signals is based on a composite gain of the AGC stages.

4. The AGC module of claim 1, wherein a gain of at least one AGC stage is constant.

5. The AGC module of claim 1, wherein the first and second current-source circuit each comprises:
   a current source configured to supply current to the emitter of the input signal transistor and to draw current from the emitter of the input signal transistor; and
   a degeneration resistance connected in parallel to the current source to control the current supplied to the emitter of the input signal transistor and the current drawn from the emitter of the input signal transistor.

6. The AGC module of claim 1, wherein the common input signal applied to the bases of the input signal transistors comprises an RF signal.

7. An Automatic Gain Control (AGC) module for controlling Noise Figure (NF) and intermodulation (IM) characteristics therein, the AGC module comprising:
- a first AGC stage comprising:
  - a first differential amplifier circuit having differential inputs, an output and a common emitter point, the differential inputs configured to receive a first control signal;
  - an first input signal transistor comprising an emitter, a base and a collector, the collector of the first input signal transistor connected to the common emitter point of the first differential amplifier circuit; and
  - a first current-source circuit connected to the emitter of the first input signal transistor;
- a second AGC stage comprising:
  - a second differential amplifier circuit having differential inputs, an output and a common emitter point, the differential inputs configured to receive a second control signal;
  - a second input signal transistor comprising an emitter, a base and a collector, the collector of the second input signal transistor connected to the common emitter point of the second differential amplifier circuit; and
  - a second current-source circuit connected to the emitter of the second input signal transistor;
- wherein a common input signal is received at bases of the first and second input signal transistors;
- wherein a common load is applied at outputs of the first and second differential amplifier circuits; and
- wherein the first control signal and the first current-source circuit are configured to control a gain of said first AGC stage and said second control signal and the second current-source circuit are configured to control a gain of said second AGC stage, and said first control signal is distinct, at least in part, from said second control signal and said first and second control signals have a predetermined relationship.

8. The AGC module of claim 7, wherein the pre-determined relationship of the first and second control signals is based on the gain of each AGC stage.

9. The AGC module of claim 7, wherein the pre-determined relationship of the first and second control signals is based on a composite gain of the AGC stages.

10. The AGC module of claim 7, wherein a gain of at least one AGC stage is constant.

11. The AGC module of claim 7, wherein the first and second current-source circuit each comprises:
- a current source configured to supply current to the emitter of the input signal transistor and to draw current from the emitter of the input signal transistor; and
- a degeneration resistance connected in parallel to the current source to control the current supplied to the emitter of the input signal transistor and the current drawn from the emitter of the input signal transistor.

12. The AGC module of claim 7, wherein the common input signal applied to the bases of the input signal transistors comprises an RF signal.

* * * * *